(12) United States Patent
Zhang

(10) Patent No.: US 7,760,892 B2
(45) Date of Patent: Jul. 20, 2010

(54) NOISE ELIMINATION CIRCUIT FOR AUDIO EQUIPMENT

(75) Inventor: Xiang Zhang, Shenzhen (CN)

(73) Assignees: Hong Fu Jin Precision Industry (ShenZhen) Co., Ltd., Shenzhen, Guangdong Province (CN); Hon Hai Precsion Industry Co., Ltd., Tu-Cheng, Taipei Hsien (TW)

( * ) Notice: Subject to any disclaimer, the term of this patent is extended or adjusted under 35 U.S.C. 154(b) by 1238 days.

(21) Appl. No.: 11/306,522

(22) Filed: Dec. 30, 2005

(65) Prior Publication Data

US 2007/0154025 A1    Jul. 5, 2007

(51) Int. Cl.
*H04B 15/00* (2006.01)

(52) U.S. Cl. .................... 381/94.5; 381/94.1; 700/94

(58) Field of Classification Search .................. 381/59, 381/94.1, 94.5, 77, 79–80, 120, 123; 700/94
See application file for complete search history.

(56) References Cited

U.S. PATENT DOCUMENTS

| 6,621,359 | B2 | 9/2003 | Lee et al. | |
|---|---|---|---|---|
| 2002/0141603 | A1* | 10/2002 | Ng et al. | 381/94.5 |
| 2005/0100170 | A1* | 5/2005 | Chen | 381/59 |

* cited by examiner

*Primary Examiner*—Xu Mei
*Assistant Examiner*—Disler Paul
(74) *Attorney, Agent, or Firm*—Wei Te Chung

(57) ABSTRACT

A noise elimination circuit of a audio output device includes a sound card for receiving a digital audio signal and transforming it to an analog audio signal; an audio reproduction apparatus such as a audio output device connected to the sound card for receiving the analog audio signal; a power supply connected to the sound card for providing a working voltage thereto; a capacitor connected between the power supply and ground; and a discharging circuit also connected between the power supply and ground, for discharging deposited current in the capacitor when the audio output device is cut off. The discharging circuit is controlled according to the state of the power supply.

12 Claims, 4 Drawing Sheets

NOISE ELIMINATION CIRCUIT FOR AUDIO EQUIPMENT

FIELD OF THE INVENTION

The present invention relates to noise elimination circuits, more particularly to a noise elimination circuit for eliminating the noise of an audio output device when it is shut off.

DESCRIPTION OF RELATED ART

Multimedia audio equipment generally includes a sound card disposed on a motherboard and an audio output device such as a loudspeaker. Referring to FIG. 1, digital audio files 10' in the computer are sent to a sound card 30' via a data port 20'. The sound card 30' transforms the digital audio files 10' into analog audio signals, and then sends them to an audio output device 40'. The sound card 30' is connected to a +5V power supply 50 in the motherboard. A filter capacitor C' and the sound card 30' are connected in parallel between the power supply 50' and ground. The performance of the power supply 50' affects the quality of the analog audio signal 10' from the audio output device 40'. A perfect power supply 50' connected to the sound card 30' for providing working voltage thereto, should be a constant power supply without internal resistance. But in fact, power supplies have internal resistances that cannot be ignored. The signals of the circuits using a common power supply 50' will interfere with each other via the internal resistance, and the greater the internal resistance the greater the interference. So, reducing the internal resistance of the power supply can help to reduce the noise of the multimedia audio equipment and enhance the fidelity of the audio signal.

In a conventional method for improving the power supply, the ordinary filter capacitor C' connected to the power supply is replaced by a large capacitance solid aluminum electrolytic capacitor, which can reduce the high frequency internal resistance of the power supply, thereby reducing the noise of the audio signal. However, due to the large capacitance of the capacitor, the current deposited in the capacitor is greater too, and so the discharging speed of the capacitor is slower. When the audio output device is shut off, there is a large deposited current flowing through the sound card causing the sound card to output an irregular signal to the audio output device, causing the audio output device to produce a harsh sound.

What is needed, therefore, is a noise elimination circuit for discharging deposited current in a capacitor.

SUMMARY OF INVENTION

A noise elimination circuit includes a sound card for receiving a digital audio signal and transforming it to an analog audio signal; an audio output apparatus connected to the sound card for receiving the analog audio signal for audible output therefrom; a power supply connected to the sound card for providing a working voltage thereto; a capacitor connected between the power supply and ground; and a discharging circuit also connected between the power supply and ground for discharging deposited current in the capacitor. Operation of the discharging circuit is controlled by the state of the power supply.

Other advantages and novel features will be drawn from the following detailed description of preferred embodiments with attached drawings, in which:

DETAILED DESCRIPTION

Figure 1:
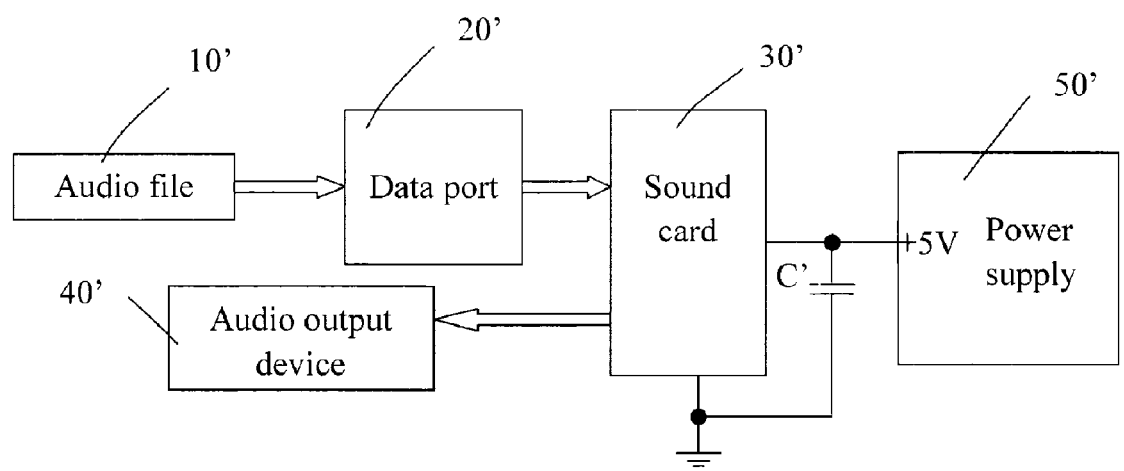
FIG. 1 is a block diagram of a conventional multimedia audio device when processing an audio file.
Figure 2:
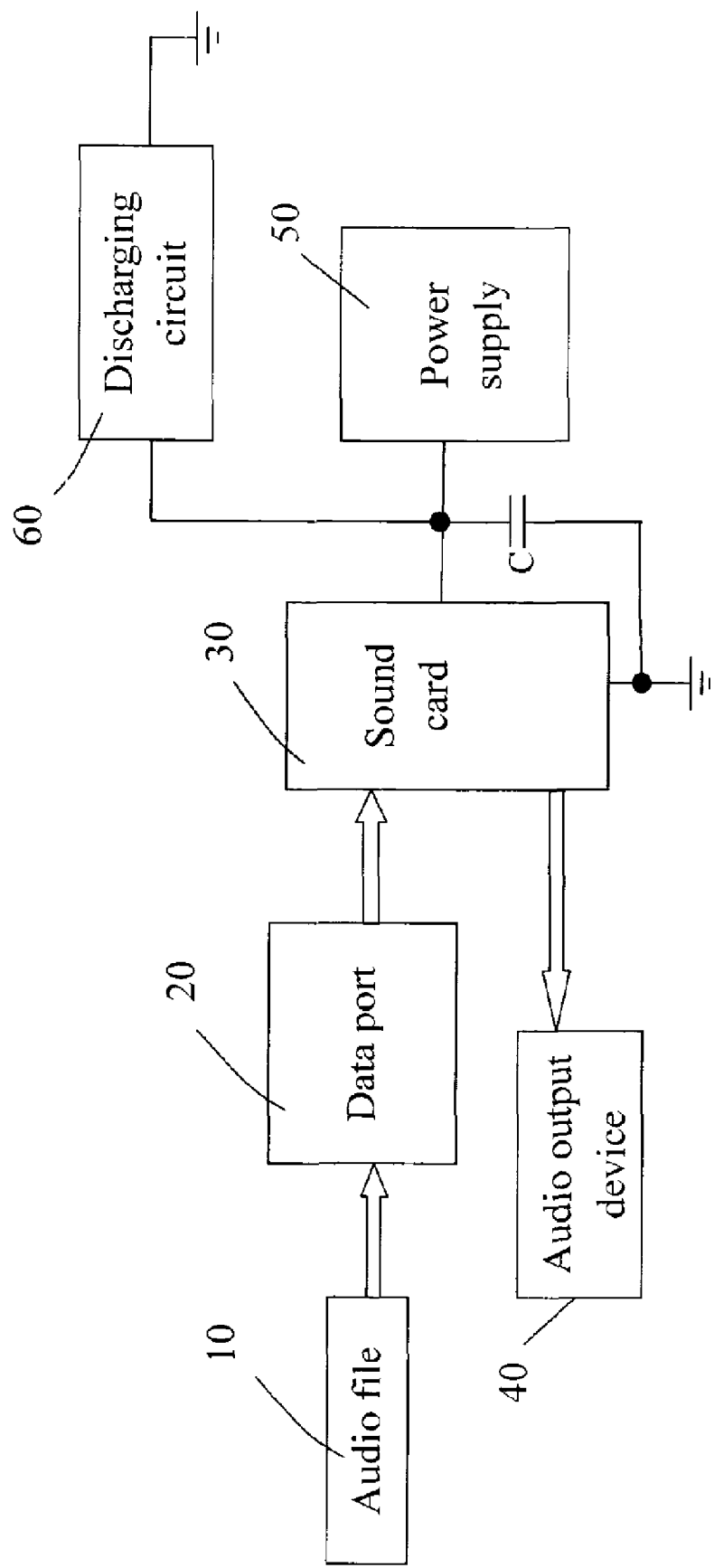
FIG. 2 is a block diagram of a noise elimination circuit in accordance with a preferred embodiment of the present invention, the noise elimination circuit includes a discharging circuit.

Referring to FIG. 2, a noise elimination circuit in accordance with a preferred embodiment of the present invention, includes a sound card 30, an audio output device 40 (such as a loudspeaker), and a power supply 50. A filter capacitor C and the sound card are connected in parallel between the power supply 50 and ground. A digital audio file 10 is sent to the sound card 30 of a motherboard via a data port 20. The digital audio file 10 is transformed into an analog audio file and transmitted to the audio output device 40 by the sound card 30. Then, the analog file is audible output by the audio output device 40. The noise elimination circuit further includes a discharging circuit 60 connected between the power supply 50 and ground, which is connected in parallel with the filter capacitor C and the sound card 30.

Figure 3:
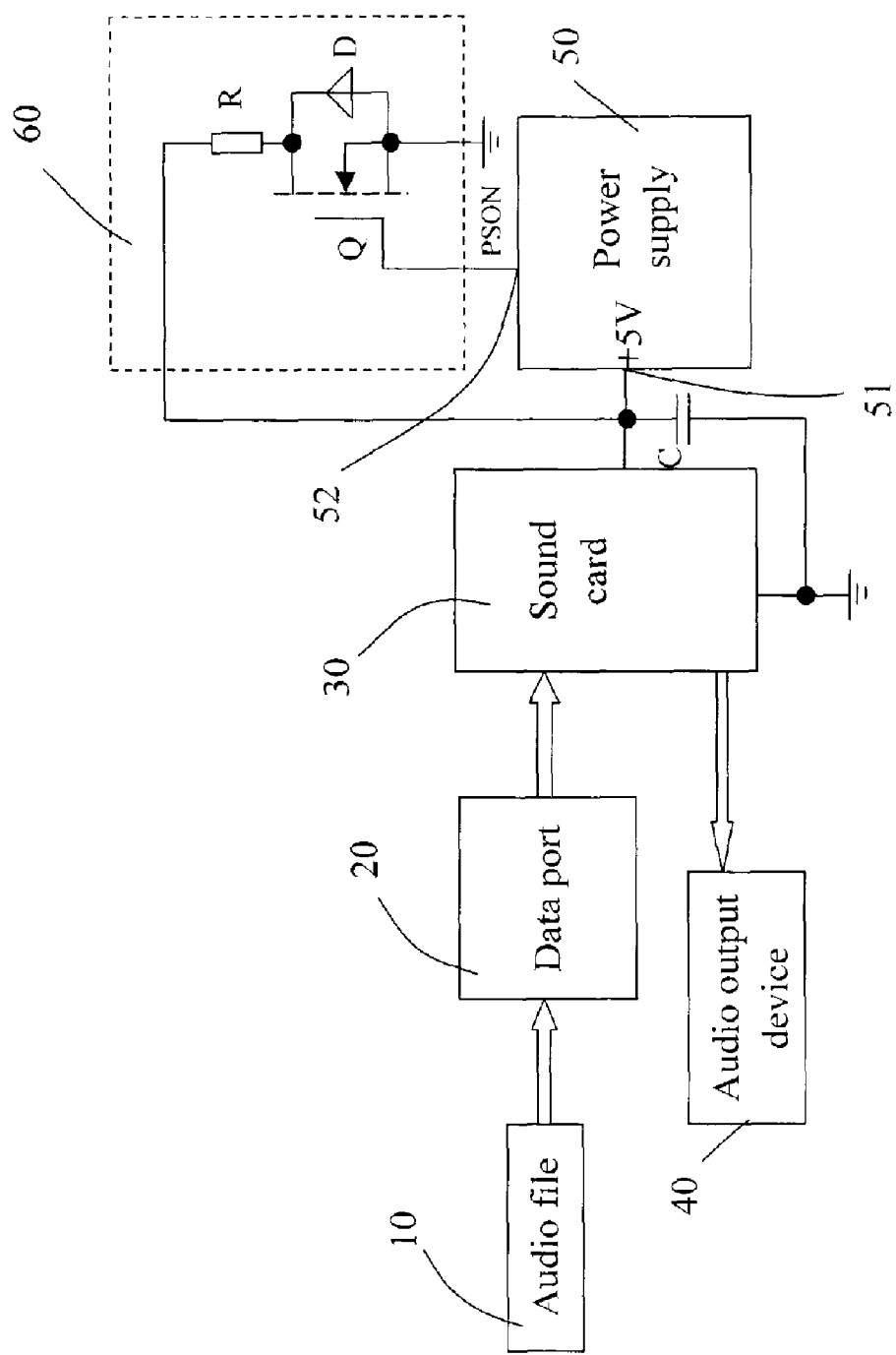
FIG. 3 is similar to FIG. 2, but showing the circuit diagram for the discharging circuit.

Referring also to FIG. 3, the discharging circuit 60 includes a protection resistor R and a transistor Q connected in series. In the present embodiment, the transistor Q is an N-channel-strength MOSFET (metal-oxide-semiconductor filed-effected-transistor). A drain electrode of the transistor Q is connected to a first terminal 51 of the power supply 50 via the resistor R. The resistance of the resistor R is as small as possible without risking damage to the transistor Q. A gate electrode of the transistor Q is connected to a second terminal 52 of the power supply 50. A source electrode of the transistor Q is connected to ground. A protection diode D is connected between the drain electrode and the source electrode of the transistor Q. When the power supply 50 is switched on, the first terminal 51 outputs a +5V voltage, and the second terminal 52 outputs a control signal PSON enabled at a low level. When the power supply 50 is shut off, the voltage output from the first terminal 51 of the power supply 50 declines to zero, and the second terminal 52 outputs the control signal PSON enabled at a high level.

When the control signal PSON is enabled at the low level, the transistor Q is closed, thereby cutting off the discharging circuit 60. The power supply 50 outputs a +5V voltage to the sound card 30 to ensure that the sound card 30 and the audio output device 40 works normally. When the control signal PSON is enabled at the high level, the power supply 50 is shut off, the transistor Q is open, and the discharging circuit 60 is switched on. Because the resistance of the resistor R is much smaller than the resistance of the sound card 30, the deposited current in the capacitor C flows through the discharging circuit 60. There is no current passing through the sound card 30, thereby eliminating the harsh noise of the audio output device 40 when the power supply 50 is shut off.

Figure 4:
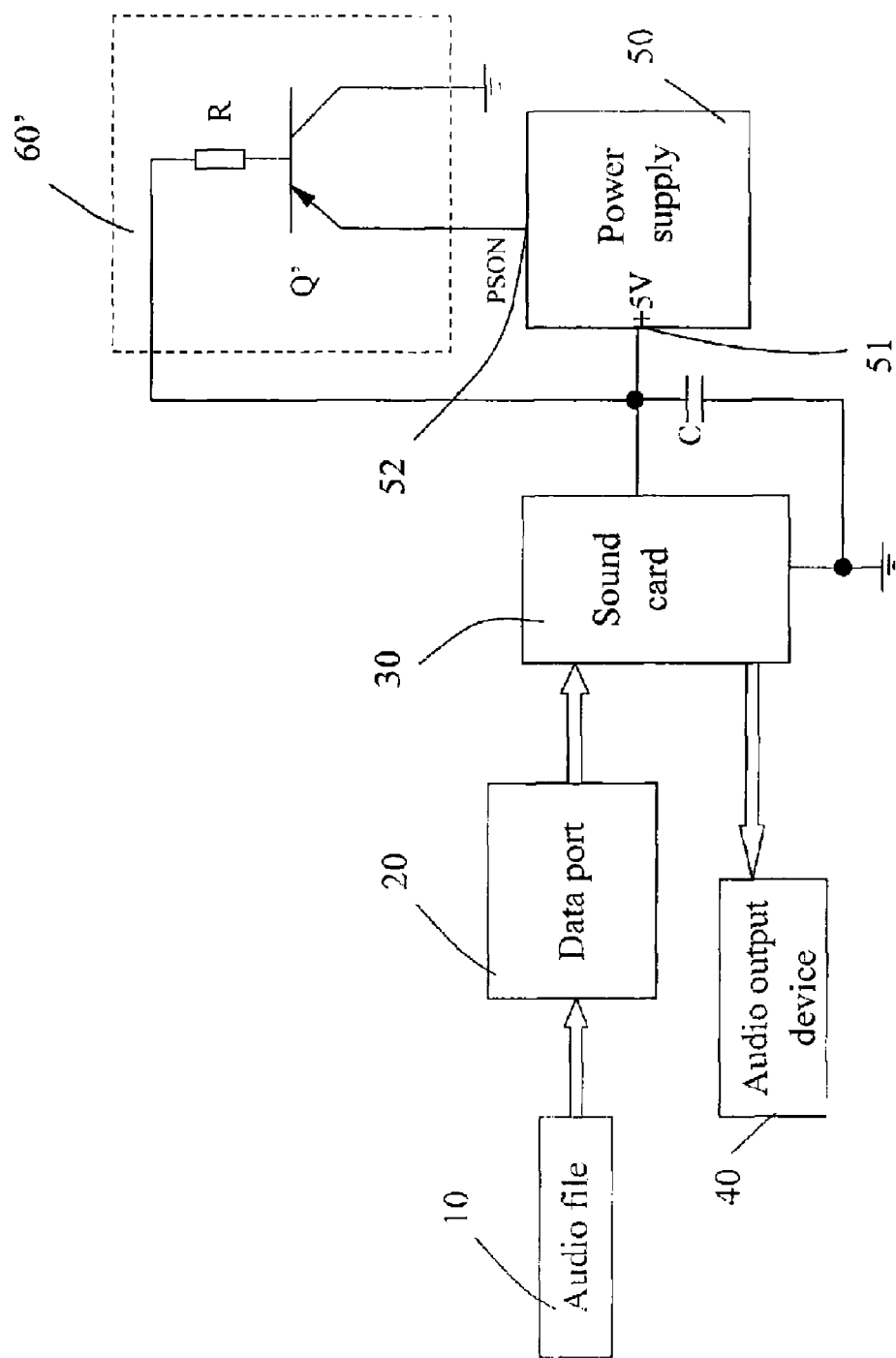
FIG. 4 is a block diagram of an alternative embodiment of the present invention.

Referring to FIG. 4, an alternative embodiment of the present invention is illustrated. In the alternative embodiment, the discharging circuit 60' is a PNP type audion Q' and the diode D is omitted. A base electrode of the audion Q' is connected to the first terminal 51 of the power supply 50 via the protection resistor R. The resistance of the protection resistor R is as small as possible without risking damage to the audion Q'. An emitter electrode of the audion Q' is connected to the second terminal 52 of the power supply 50. A collector electrode of the transistor Q' is connected to ground. The working principle of the alternative embodiment is same as the above-mentioned one.

In other embodiments, the control signal can be enabled at a high level when the power supply 50 is switched on, and enabled at a low level when the power supply 50 is shut off. Then, the discharging circuit 60 can be replaced with a P-channel-strength MOSFET or a NPN type audion. The connection relationships of these embodiments are also same as the aforementioned.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A noise elimination circuit, comprising:
   a sound card for receiving a digital audio signal and transforming the digital audio signal to an analog audio signal;
   an audio output device connected to the sound card for receiving the analog audio signal therefrom;
   a power supply connected to the sound card for providing a working voltage thereto;
   a capacitor connected between the power supply and ground; and
   a discharging circuit also connected between the power supply and ground for discharging deposited current in the capacitor when the audio output device is cut off;
   wherein the power supply comprises a first terminal for outputting the working voltage to the sound card; and the sound card, the capacitor, and the discharging circuit are connected in parallel between the first terminal of the power supply and ground.

2. The noise elimination circuit as described in claim 1, wherein the power supply comprises a second terminal outputting a control signal to the discharging circuit, the control signal is enabled at different state by the power supply for controlling the discharging circuit to be switched on or cut off.

3. The noise elimination circuit as described in claim 2, wherein the discharging circuit comprises a transistor acting as a switch.

4. The noise elimination circuit as described in claim 3, wherein the transistor is a MOSFET, a drain electrode of the MOSFET is connected to the first terminal of the power supply via a protection resistor, a gate electrode of the MOSFET is connected to the second terminal of the power supply, and a source electrode of the MOSFET is connected to ground.

5. The noise elimination circuit as described in claim 3, wherein the transistor is a audion, a base electrode of the audion is connected to the first terminal of the power supply via a protection resistor, an emitter electrode of the audion is connected to the second terminal of the power supply, and a collector electrode of the audion is connected to ground.

6. The noise elimination circuit as described in claim 1, wherein the discharging circuit is cut off when the power supply is switched on, and switched on when the power supply is shut off.

7. A noise elimination circuit, comprising:
   a sound card for receiving a digital audio signal and transforming the digital audio signal to an analog audio signal;
   an audio output device connected to the sound card for receiving the analog audio signal for audible output;
   a capacitor connected between a power supply and ground;
   a discharging circuit connected between the power supply and ground for discharging deposited current in the capacitor; and
   a power supply having a first terminal for providing a working voltage to the sound card and a second terminal outputting a control signal for controlling the discharging circuit to be switched on or cut off;
   wherein the sound card, the capacitor, and the discharging circuit are connected in parallel between the first terminal of the power supply and ground.

8. The noise elimination circuit as described in claim 7, wherein the control signal output from the second terminal of the power supply is enabled at a high level when the power supply is shut off, and enabled at a low level when the power supply is switched on.

9. The noise elimination circuit as described in claim 7, wherein the discharging circuit comprises a transistor acting as a switch.

10. The noise elimination circuit as described in claim 9, wherein the transistor is a N-channel-strength MOSFET, a drain electrode of the N-channel-strength MOSFET is connected to the first terminal of the power supply via a protection resistor, a gate electrode of the N-channel-strength MOSFET is connected to the second terminal of the power supply, and a source electrode of the N-channel-strength MOSFET is connected to ground.

11. The noise elimination circuit as described in claim 9, wherein the transistor is a PNP audion, a base electrode of the PNP audion is connected to the first terminal of the power supply via a protection resistor, a collector electrode of the PNP audion is connected to the second terminal of the power supply. An emitter electrode of the PNP audion is connected to ground.

12. The noise elimination circuit as described in claim 7, wherein the discharging circuit is cut off when the power supply is switched on, and switched on when the power supply is shut off.

* * * * *